United States Patent
Izumisawa et al.

(10) Patent No.: US 6,878,989 B2
(45) Date of Patent: Apr. 12, 2005

(54) POWER MOSFET SEMICONDUCTOR DEVICE AND METHOD OF MANUFACTURING THE SAME

(75) Inventors: Masaru Izumisawa, Kawasaki (JP); Shigeo Kouzuki, Kawasaki (JP); Shinichi Hodama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 10/151,900

(22) Filed: May 22, 2002

(65) Prior Publication Data

US 2002/0175368 A1 Nov. 28, 2002

(30) Foreign Application Priority Data

May 25, 2001 (JP) ........................................ 2001-157485

(51) Int. Cl.$^7$ ............................................. H01L 29/732
(52) U.S. Cl. ........................ 257/328; 257/329; 257/335; 257/341; 257/506; 257/505; 257/520
(58) Field of Search ................................ 257/328, 329, 257/335, 341, 505, 506, 520

(56) References Cited

U.S. PATENT DOCUMENTS

| | | | |
|---|---|---|---|
| 4,754,310 A | | 6/1988 | Coe |
| 5,016,066 A | * | 5/1991 | Takahashi .................. 257/339 |
| 5,216,275 A | | 6/1993 | Chen |
| 5,438,215 A | | 8/1995 | Tihanyi et al. |
| 5,893,736 A | * | 4/1999 | Lee et al. .................. 438/271 |
| 5,973,360 A | * | 10/1999 | Tihanyi ..................... 257/330 |
| 5,981,996 A | | 11/1999 | Fujishima |
| 6,040,600 A | * | 3/2000 | Uenishi et al. ............. 257/330 |
| 6,066,878 A | | 5/2000 | Neilson |
| 6,081,009 A | * | 6/2000 | Neilson ..................... 257/341 |
| 6,172,398 B1 | * | 1/2001 | Hshieh ....................... 257/330 |
| 6,184,555 B1 | * | 2/2001 | Tihanyi et al. ............ 257/342 |
| 6,337,499 B1 | * | 1/2002 | Werner ....................... 257/329 |
| 6,410,958 B1 | * | 6/2002 | Usui et al. ................. 257/329 |
| 6,445,037 B1 | * | 9/2002 | Hshieh et al. ............. 257/330 |
| 6,521,954 B1 | * | 2/2003 | Kouzuki et al. ............ 257/374 |

FOREIGN PATENT DOCUMENTS

| | | |
|---|---|---|
| JP | 8-222735 | 8/1996 |
| JP | 10-223896 | 8/1998 |
| JP | 11-233759 | 8/1999 |
| JP | 2000-40822 | 2/2000 |
| JP | 2000-504879 | 4/2000 |
| JP | 2000-208527 | 7/2000 |
| JP | 2000-260982 | 9/2000 |
| JP | 2000-260984 | 9/2000 |

(Continued)

OTHER PUBLICATIONS

T. Minato, et al. "Whixh is cooler, Trench or Multi–Epitaxy?", ISPSD 2000, Jun. 2000, 4 pages.

*Primary Examiner*—George Eckert
*Assistant Examiner*—Eugene Lee
(74) *Attorney, Agent, or Firm*—Oblon, Spivak, McClelland, Maier & Neustadt, P.C.

(57) ABSTRACT

A semiconductor device includes a semiconductor substrate of a first conductivity type, on which a semiconductor layer having a trench extending in the depth direction toward the semiconductor substrate is formed. A first region of the first conductivity type is formed in the depth direction along one side of the trench in the semiconductor layer and contacts the semiconductor substrate. A second region of the first conductivity type is formed in a surface area of the semiconductor layer and close to the trench and contacts the first region. A third region of the second conductivity type is formed in the surface area of the semiconductor layer. A fourth region of the first conductivity type is formed in a surface area of the third region. A gate insulation film and a gate electrode are provided on the surface of the third region between the second region and the fourth region.

60 Claims, 16 Drawing Sheets

FOREIGN PATENT DOCUMENTS

| | | |
|---|---|---|
| JP | 2001-102577 | 4/2001 |
| JP | 2001-111041 | 4/2001 |
| JP | 2001-119022 | 4/2001 |
| JP | 2001-127289 | 5/2001 |
| JP | 2001-168327 | 6/2001 |
| JP | 3221489 | 8/2001 |
| JP | 2001-230412 | 8/2001 |
| JP | 2001-230413 | 8/2001 |
| JP | 2001-244461 | 9/2001 |
| JP | 2001-267568 | 9/2001 |
| JP | 2001-298191 | 10/2001 |
| JP | 2001-313391 | 11/2001 |

* cited by examiner

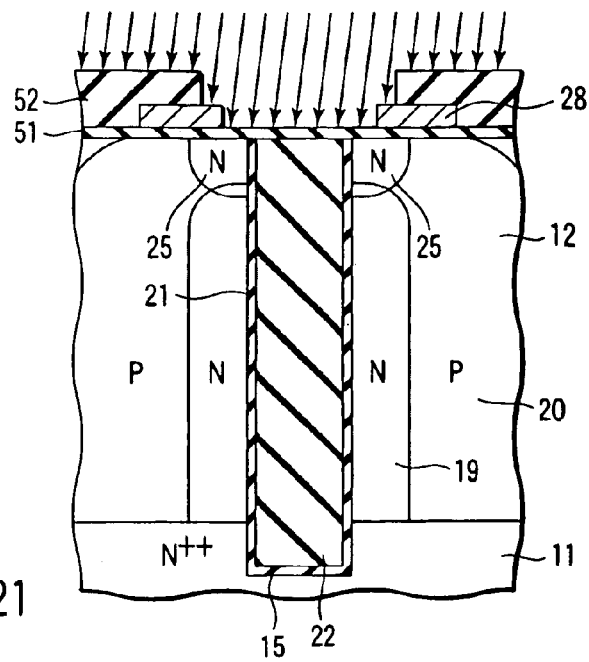
FIG. 21
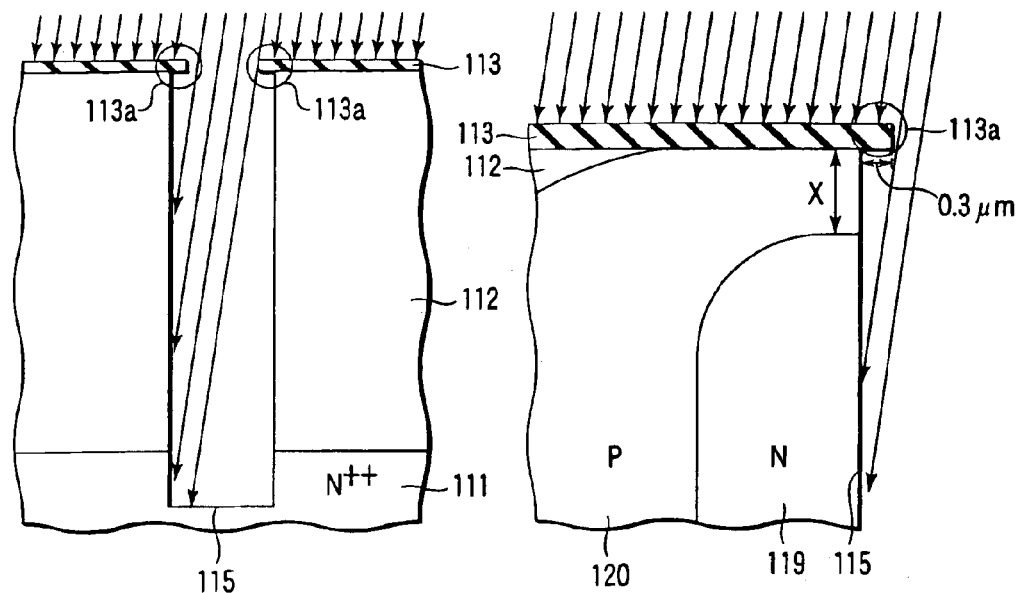
FIG. 23
PRIOR ART
FIG. 24
PRIOR ART

POWER MOSFET SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2001-157485, filed May 25, 2001, the entire contents of which are incorporated herein by reference.

BACKGROUND OF THE INVENTION

1. Field of the Invention

The present invention relates to a power MOSFET semiconductor device used for control of high power and a method of manufacturing the semiconductor device.

2. Description of the Related Art

A deep trench MOSFET (referred to as DTMOS hereinafter) has recently been proposed as a power-switching device using a MOSFET.

BRIEF SUMMARY OF THE INVENTION

A semiconductor device according to a first aspect of the present invention comprises a semiconductor substrate of a first conductivity type, a semiconductor layer provided on the semiconductor substrate, a trench extending in a depth direction toward the semiconductor substrate from a surface of the semiconductor layer, a first region of the first conductivity type formed in the depth direction on and along a side of the trench in the semiconductor layer, a bottom of the first region contacting the semiconductor substrate, a second region of the first conductivity type formed in a surface area of the semiconductor layer and close to the side of the trench, the second region contacting the first region, a third region of the second conductivity type formed in the surface area of the semiconductor layer, a fourth region of the first conductivity type formed in a surface area of the third region, and a gate electrode provided on a surface of the third region between the second region and the fourth region, a gate insulation film being interposed between the gate electrode and the second region.

A method of manufacturing a semiconductor device according to a second aspect of the present invention, comprises forming a semiconductor layer on a semiconductor substrate of a first conductivity type, forming a trench having a first opening in the semiconductor layer, the trench extending in a depth direction toward the semiconductor substrate, ion-implanting first and second impurities into an inner wall of the trench through the first opening, diffusing the first impurities to form a first region of the first conductivity in the depth direction on and along a side of the trench in the semiconductor layer, a bottom of the first region contacting the semiconductor substrate, diffusing the second impurities to form a second region of a second conductivity type in the depth direction along the first region in the semiconductor layer, the second region contacting one side of the first region, which is opposite to another side contacting the trench, burying a filling layer into the trench, forming a third region of the first conductivity type in a surface area of the semiconductor layer and close to the side of the trench, the third region contacting the first region, forming a fourth region of the second conductivity type in the surface area of the semiconductor layer, the fourth region having impurity concentration which is higher than that of the second region, and forming a fifth region of the first conductivity type in a surface area of the fourth region.

BRIEF DESCRIPTION OF THE SEVERAL VIEWS OF THE DRAWING

FIG. 21 is a schematic cross-sectional view showing a manufacturing step of the semiconductor device according to the third embodiment of the present invention, which is subsequent to the step shown in FIG. 9.

FIG. 23 is a cross-sectional view explaining a problem of the manufacturing step of a semiconductor device of FIG. 22.

FIG. 24 is cross-sectional view showing a manufacturing step subsequent to the step of FIG. 23.

DETAILED DESCRIPTION OF THE INVENTION

Figure 22:
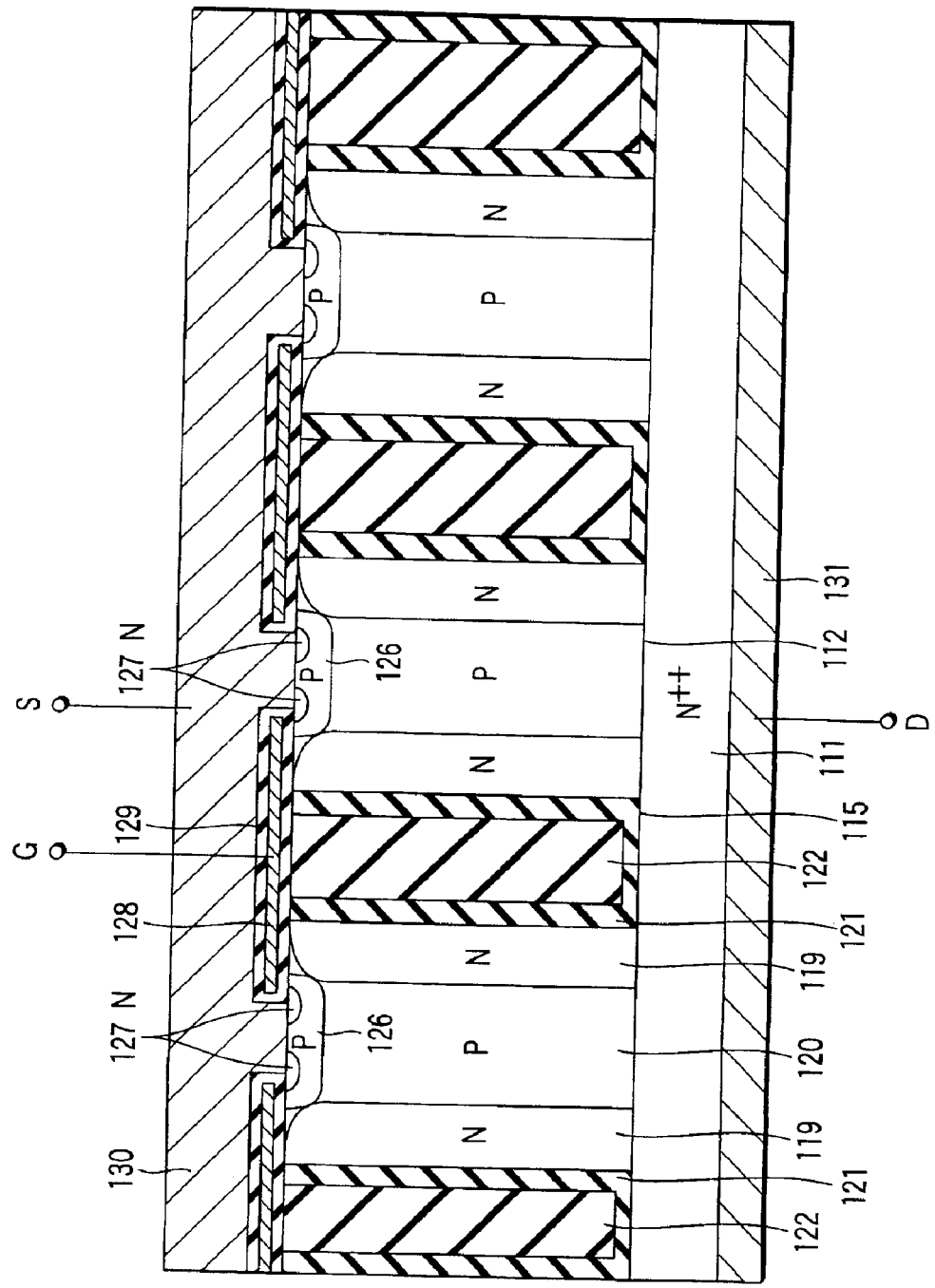
FIG. 22 is a schematic cross-sectional view of a semiconductor device with a DTMOS having an ideal structure.

FIG. 22 is a schematic cross-sectional view of a DTMOS having an ideal structure. The DTMOS has a so-called super junction structure in which N- and P-type pillar layers 119 and 120 serving as a current path are formed in the depth (vertical) direction between trenches 115. As shown in FIG. 22, a low-concentration N⁻-type semiconductor layer 112 is provided on a high-concentration N⁺-type semiconductor substrate (silicon substrate) 111. A deep trench 115 is formed in the semiconductor layer 112. An N-type pillar layer 119 is formed on either side of the trench 115 in the semiconductor layer 112. The top of the N-type pillar layer 119 reaches the surface of the semiconductor layer 112. A P-type pillar layer 120 is formed adjacent to the N-type pillar layer 119. A buried layer 122 is formed as an element isolating insulation film in the trench 115 with an oxide film 121 interposed therebetween.

A high-concentration P⁺-type base layer 126 is formed in the surface area of the semiconductor layer 112, and a high-concentration N⁺-type source layer 127 is formed in the surface area of the base layer 126. A gate electrode 128 is formed on the semiconductor layer 112 with a gate insulation film interposed therebetween. The gate electrode 128 is covered with an interlayer insulation film 129. A source electrode 130 is formed on the interlayer insulation film 129, and a drain electrode 131 is formed on the undersurface of the substrate 111.

The super junction structure allows the devices to increase in withstand voltage and to decrease in on-resistance.

The inventors of the present invention studied a manufacturing process of the DTMOS as shown in FIG. 22 in the process of development of the present invention and obtained the following findings.

First, a method of manufacturing a DTMOS having a structure as described above will be described in brief with reference to FIG. 22. A semiconductor layer 112 is formed on a semiconductor substrate 111 by epitaxial growth. A mask layer is formed on the semiconductor layer 112 and then patterned. Using the patterned mask layer as a mask, a deep trench 115 is formed in the semiconductor layer 112 by anisotropic etching. N-type and P-type impurities are implanted into the inner walls of the trench 115 and diffused thermally, thereby forming an N-type pillar layer 119 and a P-type pillar layer 120 along the trench 115. After that, a buried layer 122 is formed in the trench 115 with an oxide layer 121 interposed therebetween.

A base layer 126 is selectively formed in a surface area of the semiconductor layer 112 and a source layer 127 is selectively formed in the base layer 126. Then, a gate electrode 128 is formed on the semiconductor layer 112 with a gate insulation film interposed therebetween and covered with an interlayer insulation film 129. A source electrode 130 is formed on the interlayer insulation film 129 and a drain electrode 131 is formed on the undersurface of the substrate 111.

The DTMOS formed through the above process does not have any ideal structure as shown in FIG. 22 and thus causes the following problems.

When a deep trench 115 is formed in the semiconductor layer 112 by anisotropic etching using the mask layer 113 as shown in FIG. 23, the semiconductor layer 112 is etched more widely than the opening of the mask layer 113, and the mask layer 113 overhangs the trench 115. Such a structure is called an overhang. If a trench 115 having a depth of 60 $\mu$m by anisotropic etching having a large directional selective etching ratio of, e.g., 200, the inner walls of the trench 115 each retreats by 0.3 $\mu$m to form projected portions 113a of the mask layer 113. When ions are implanted into the inner wall of the trench 115 at a low angle leaving the projected portions 113a as they are, the projected portions 113a become a barrier against ion implantation.

Figure 25:
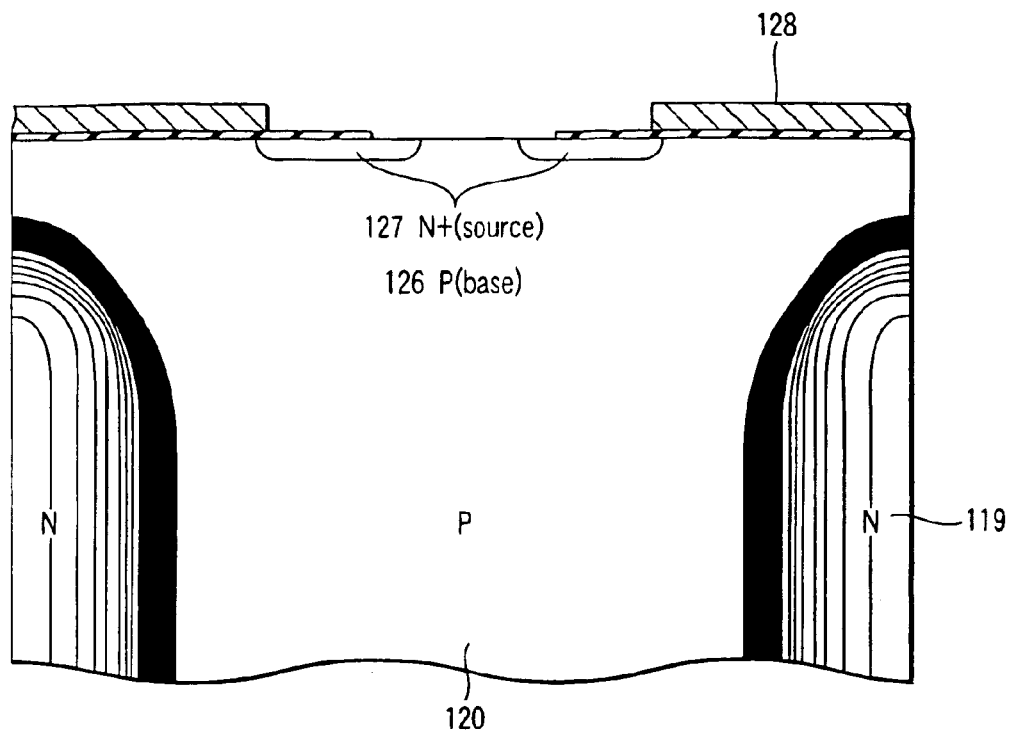
FIG. 25 is a contour map of the distribution of concentrations of an N-type pillar layer of a semiconductor device of FIG. 24.

Though the ion-implanted impurities are thermally diffused, no N-type pillar layer 119 is formed on the side of the trench 115 in the upper region of the semiconductor layer 112, as shown in FIGS. 24 and 25. In other words, the N-type pillar layer 119 does not reach the surface of the semiconductor layer 112. When the length of a projected portion 113a is 0.3 $\mu$m and the angle of ion implantation is 7°, the length X (corresponding to the distance from the surface of the semiconductor layer 112 to the end of the N-type pillar layer 119) of a region into which no impurities are ion-implanted is 2.4 $\mu$m. When the angle of ion implantation is 5°, distance X is 3.4 $\mu$m.

When the N-type pillar layer 119 does not reach the surface of the semiconductor layer 112, a current path of a MOSFET having a vertical PN junction is cut off; therefore, the MOSFET does not operate normally even though a channel is formed in an inverted region. In order to resolve this problem, the N-type pillar layer 119 needs to be formed up to the surface of the semiconductor layer 112.

Figure 26:
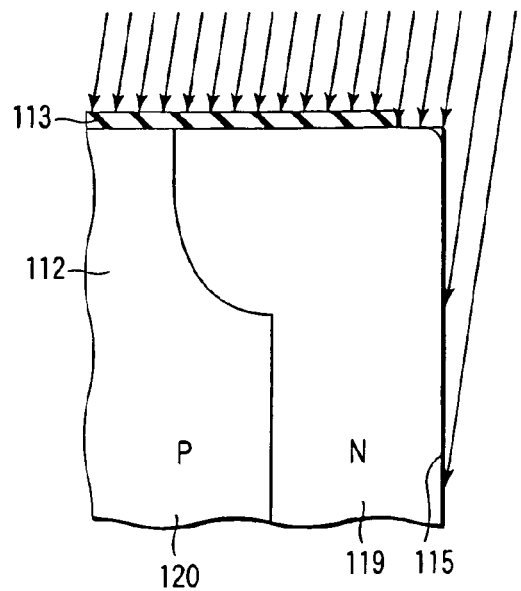
FIG. 26 is a cross-sectional view explaining a problem of the manufacturing step of a semiconductor device of FIG. 22.

As a first method, after the trench 115 is formed using the mask layer 113, the opening of the mask layer 113 can be broadened more than that of the trench 115 by isotropic etching and then ion-implantation can be performed. Taking into consideration variations in the amount of overhang and the amount of isotropic etching within a wafer, however, it is difficult to broaden the opening of the mask layer 113 by a desired amount in each of trenches 115 within the wafer. If the opening of the mask layer 113 is broadened too much as shown in FIG. 26, the surface of the semiconductor layer 112 is exposed to cause an exposed region 112a to appear. Since impurities are ion-implanted into the inner wall of the trench 115 at a low angle, a dose of impurities is high. When ions are implanted into the exposed region 112a, the concentration of the region 112a becomes very high, which exerts an influence upon the characteristics of the MOSFET formed on a semiconductor layer 112 and the shape of a diffusion layer. If the concentration of the exposed region 112a is high especially when a super junction is formed by ion-implanting N- and P-type impurities into the inner wall of the trench 115 and simultaneously diffusing them, the reverse bias withstand voltage of the elements will be lowered.

Figure 27:
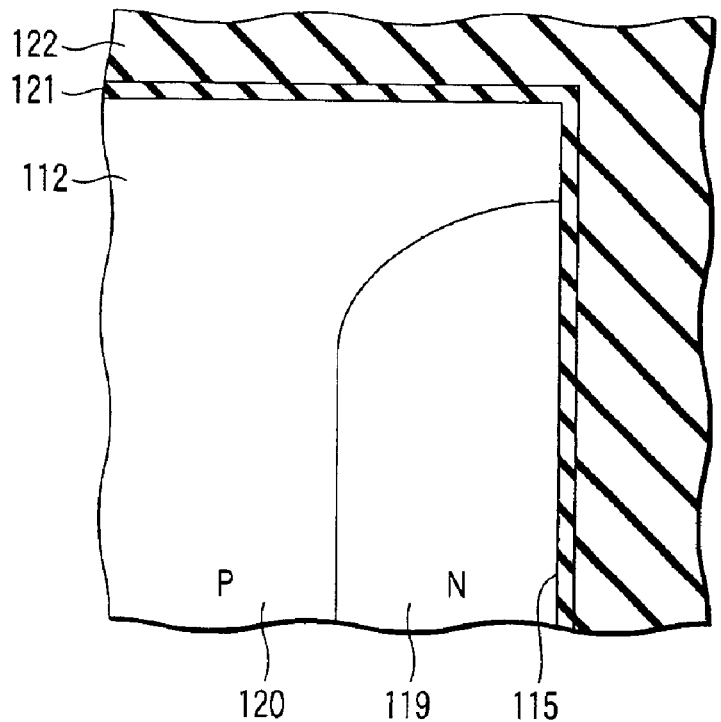
FIG. 27 is a cross-sectional view explaining a problem of the manufacturing step of a semiconductor device of FIG. 22.
Figure 28:
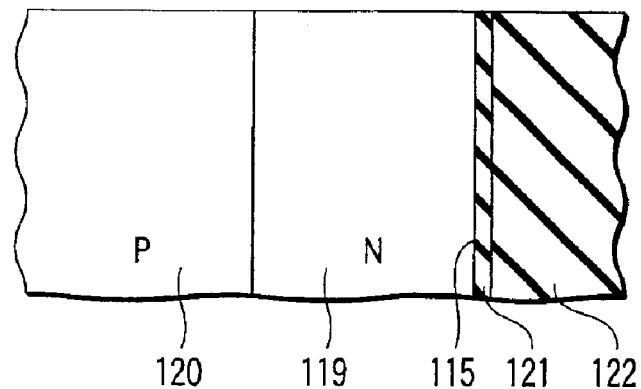
FIG. 28 is cross-sectional view showing a manufacturing step subsequent to the step of FIG. 27.

As a second method, the upper region of the semiconductor layer 112 where the N-type pillar layer 119 is not formed can be removed. In other words, impurities are ion-implanted and diffused into the trench 115 leaving the projected portions 113a of the mask layer 113 as they are, and then the mask layer 113 is removed. As shown in FIG. 27, a buried layer 122 is formed in the trench 115 with an oxide film 121 interposed therebetween. After that, as shown in FIG. 28, the semiconductor layer 112, oxide film 121, and buried layer 122 are removed by, e.g., polishing until the upper region of the semiconductor layer 112 where the N-type pillar layer 119 is not formed disappears. The surfaces of the layer 112, film 121 and layer 122 are flattened. In this case, however, the semiconductor layer 112 has to be epitaxially grown thickly in advance by the amount of flattening and elimination, the manufacturing costs will be increased.

It is difficult to form the N-type pillar layer 119 up to the surface of the semiconductor layer 112 in the foregoing process. Consequently, it is difficult to resolve the problem that a source-to-drain current path is cut off.

Embodiments of the present invention developed on the basis of the foregoing findings will now be described with reference to the accompanying drawings. The components having substantially the same function and structure are denoted by the same reference numerals and their descriptions are repeated only when the need arises.

The embodiments of the present invention relates to a power MOSFET and more specifically to a DTMOS having a vertical NPN structure. In this DTMOS, an N-type pillar layer serving as a current path and a P-type pillar layer for maintaining a reverse withstand voltage between drain and source regions are formed in the depth direction between trenches formed in a semiconductor layer.

First Embodiment

Figure 1:
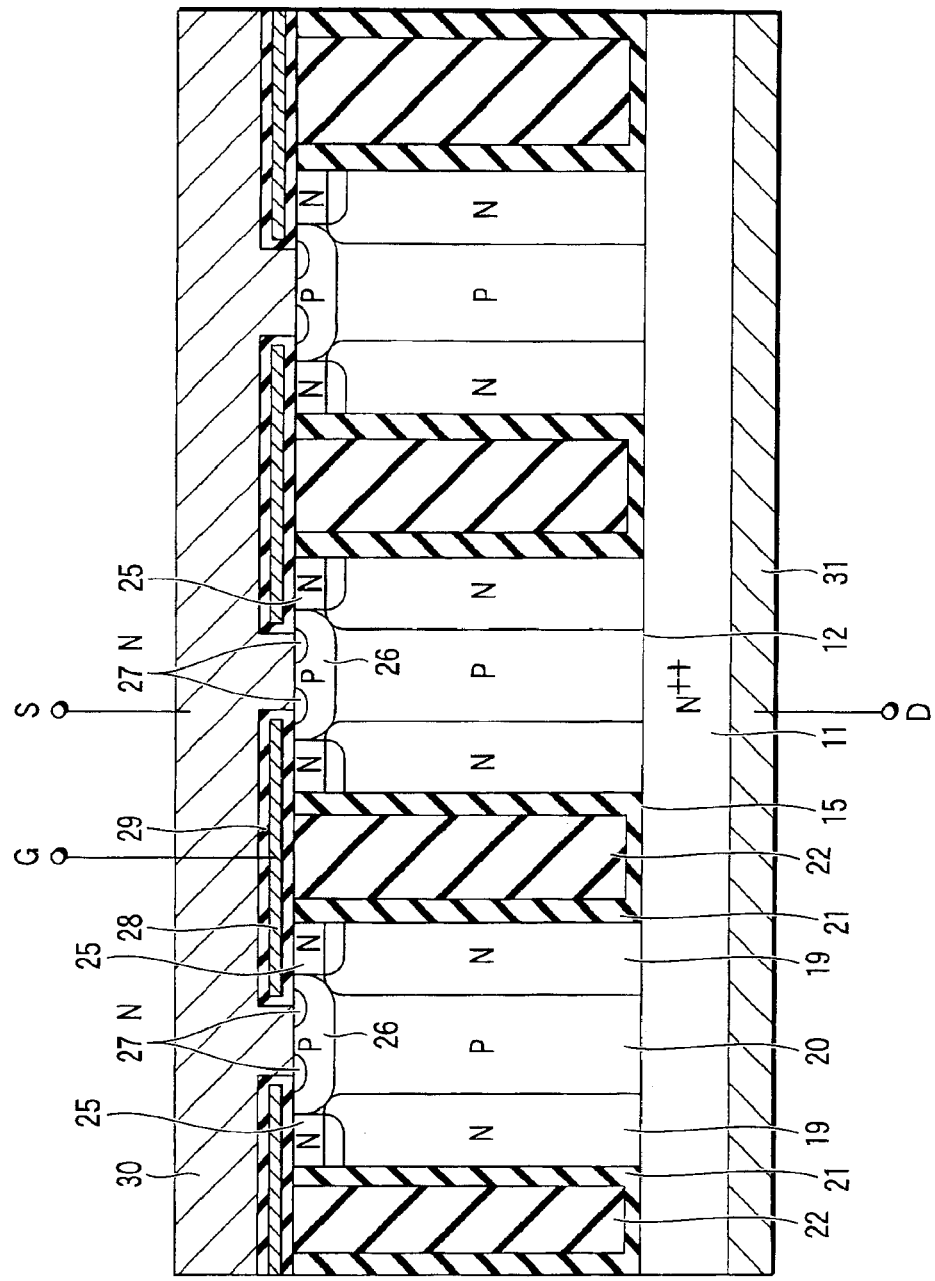
FIG. 1 is a schematic cross-sectional view of a semiconductor device according to a first embodiment of the present invention.

FIG. 1 is a schematic cross-sectional view showing a semiconductor device according to a first embodiment of the present invention as a DTMOS having a vertical NPN structure. The first embodiment is directed to an N-channel DTMOS. However, the present invention can be applied to a P-channel DTMOS by varying impurities appropriately.

Figures 2, 4:
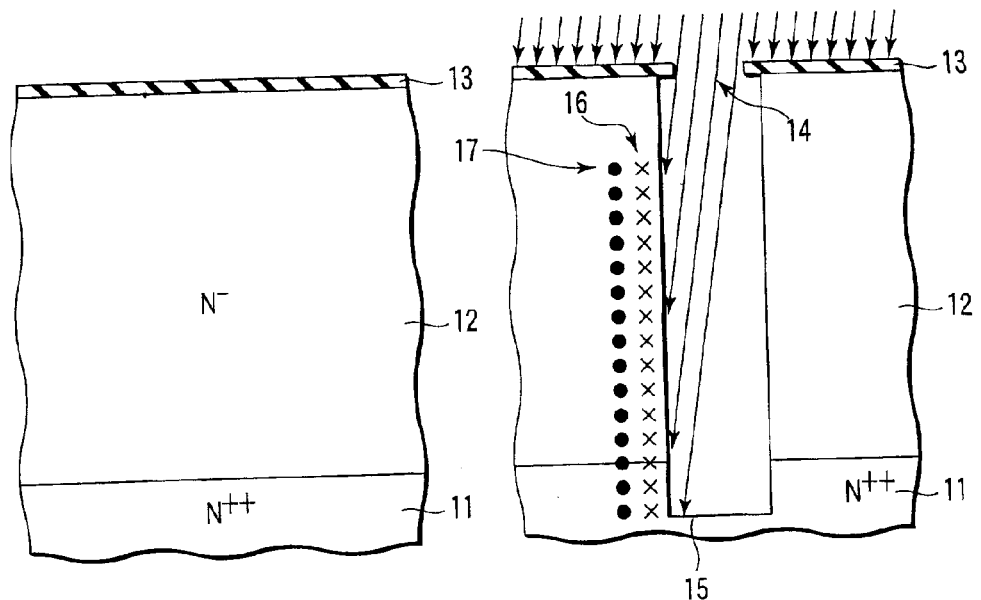
FIG. 2 is a cross-sectional view showing a manufacturing step of the semiconductor device of FIG. 1.
FIG. 4 is a cross-sectional view showing a manufacturing step subsequent to the step of FIG. 3.

As depicted in FIG. 2, a low-concentration $N^-$-type semiconductor layer 12 is provided on a high-concentration $N^{++}$-type semiconductor substrate (silicon substrate) 11. The semiconductor layer 12 can be of a low-concentration $P^-$-type. As depicted in FIG. 1, a deep trench 15 extends in the depth direction toward the substrate 11 through the semiconductor layer 12. The trench 15 reaches the semiconductor substrate 11. A buried layer (filling layer) 22, which is composed of one of polysilicon, amorphous silicon, and a dielectric, is formed in the trench 15 through an oxide film 21 provided on the surface of the trench 15. The trench 15 is filled with the buried layer 22. The buried layer 22 serves as an element isolating insulating film. The oxide film 21 isolates the semiconductor layer 12 and the buried layer 22 from each other.

A first N-type pillar layer 19 is formed along and on either side of the trench 15 in the depth direction. The top of the pillar layer 19 is located away from the surface of the semiconductor layer 12 and the bottom thereof contacts the semiconductor substrate 11. A P-type pillar layer 20 contacts one side of the first N-type pillar layer 19, which is opposite to the other side contacting the trench 15. The pillar layer 20 is formed in the depth direction along the pillar layer 19. Thus, a super junction structure is obtained.

A second N-type pillar layer 25 is provided on either side of the trench 15 in the surface area of the semiconductor layer 12. The top of the pillar layer 25 reaches the surface of the semiconductor layer 12 and the bottom portion thereof overlaps the top portion of the first N-type pillar layer 19.

Consequently, the first and second N-type pillar layers 19 and 25 are electrically connected to each other. These pillar layers 19 and 25 serve as a source-to-drain current path.

A high-concentration $P^+$-type base layer 26 is provided between adjacent second N-type pillar layers 25 in the surface area of the semiconductor layer 12. Ends of the base layer 26 may contact the second N-type pillar layer 25 and a corner of the layer 26 may contact the first N-type pillar 19. A high-concentration $N^+$-type source layer 27 is formed in the surface area of the $P^+$-type base layer 26. One end of the source layer 27 is located at a given distance from that of the base layer 26. A gate electrode 28 is formed on the semiconductor layer 12 with a gate insulation film interposed therebetween. The gate electrode 28 is covered with an interlayer insulation film 29. The gate electrode 28 and interlayer insulation film 29 are formed above at least the trench 15 and their ends extend to a region between the base layer 26 and source layer 27. This region serves as a channel. A source electrode 30 is formed on the interlayer insulation film 29 and a drain electrode 31 is formed on the undersurface of the substrate 11.

FIGS. 2 to 11 are schematic cross-sectional views each showing a manufacturing step of the semiconductor device described above. A method of manufacturing the semiconductor device will be described below.

First, as shown in FIG. 2, a semiconductor layer 12 is formed on a semiconductor substrate 11 by epitaxial growth. A mask layer 13 is formed on the surface of the semiconductor layer 12. The mask layer 13 is a two-layered film including a thermal oxide film and a CVD (chemical vapor deposition) film.

Figures 3, 5:
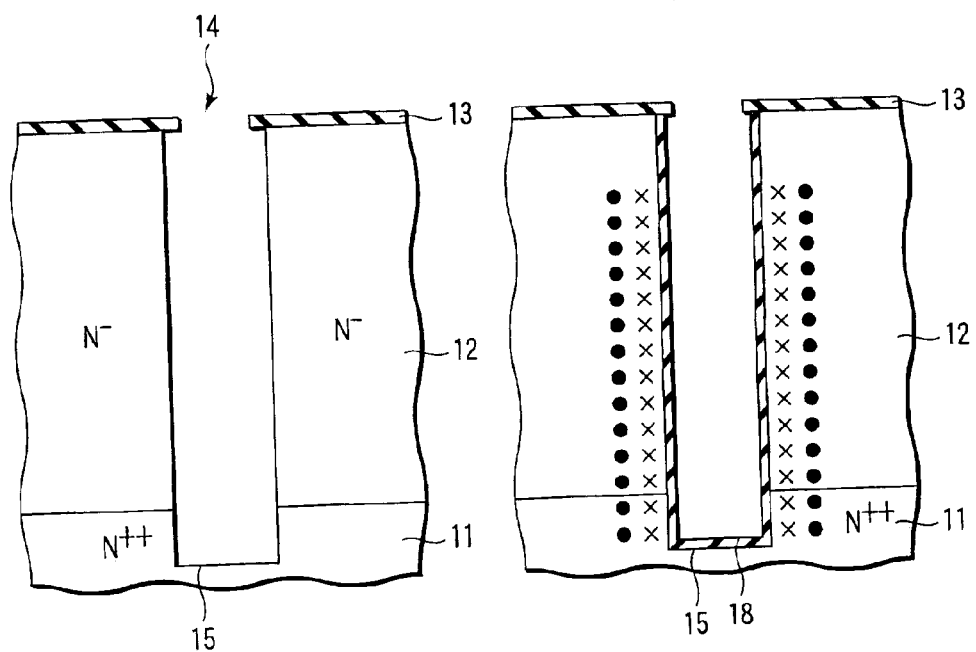
FIG. 3 is a cross-sectional view showing a manufacturing step subsequent to the step of FIG. 2.
FIG. 5 is a cross-sectional view showing a manufacturing step subsequent to the step of FIG. 4.

Then, as shown in FIG. 3, the mask layer 13 is patterned by lithography and etching to form an opening 14 through which part of the surface of the semiconductor layer 12 is exposed to the mask layer 13. Anisotropic etching is performed using the mask layer 13 with the opening 14 as a mask to form a trench 15 that reaches into the substrate 11 through the semiconductor layer 12.

It is desirable that the etching for forming the trench 15 be performed using an apparatus having a high etching rate, such as an ICP (inductively coupled plasma) apparatus and a magnetron RIE (reactive ion etching) apparatus. The reason is as follows. The etching using such an apparatus allows time for forming the trench 15 to be shortened greatly.

As shown in FIG. 4, N- and P-type impurities are continuously ion-implanted at a low angle into the inner wall of the trench 15 through the opening 14, thereby forming N- and P-type impurity regions 16 and 17. The N- and P-type impurities are ion-implanted into both inner walls of the trench 15 at once; however, they can be done into one of the inner walls first and then into the other inner wall. A wafer-spin type ion implanter can be used for ion implantation into both the inner walls of the trench 15.

The N- and P-type impurities are selected such that the diffusion constant of the P-type impurities becomes larger than that of the N-type impurities. In the N-channel DTMOS, arsenic (As) is used as N-type impurities and boron (B) is used as P-type impurities. In this case, arsenic is ion-implanted under conditions that an acceleration voltage is 40 keV and a dose is $2.5 \times 10^{13}$ cm$^{-2}$ and so is boron under the same conditions.

In order to perform the ion implantation into the trench 15 deeply, the impurities need to be ion-implanted at such an angle that they can reach the sides of the substrate 11 on the bottom portion of the trench 15 or the opening of the mask layer 13 needs to be sufficiently broadened. When the depth of the trench 15 is 60 μm, the thickness of the semiconductor layer 12 is 56 μm, and the angle of ion implantation to the vertical direction is 7°, the mask layer 13 requires an about-7-μm-width opening.

As illustrated in FIG. 5, a thermal oxide film 18 having a thickness of about 500 Å is formed on the surface of the trench 15 by thermal oxidation.

Figure 6:
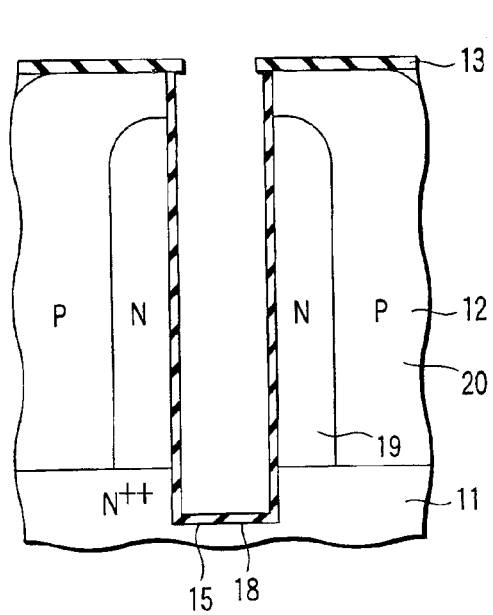
FIG. 6 is a cross-sectional view showing a manufacturing step subsequent to the step of FIG. 5.

As illustrated in FIG. 6, the N- and P-type impurities are diffused at once by thermal oxidation under conditions that temperature is 1150° C. and diffusion time is 270 minutes, with the result that a first N-type pillar layer 19 and a P-type pillar layer 20 forming a super junction structure are formed. The pillar layers, however, can be formed in different steps. For example, after N-type impurities are ion-implanted and thermally diffused, P-type impurities can be ion-implanted and thermally diffused, and vice versa. The process, however, can be executed more easily when two different impurities are implanted in sequence to form the N- and P-type impurity regions 16 and 17 than when two different impurities are implanted separately from each other.

If arsenic is used as the N-type impurities and boron is used as the P-type impurities, the diffusion constant of arsenic at 1150° C. is about $1.8 \times 10^{-2}$ μm$^2$/h and that of boron is about $1.1 \times 10^{-1}$ μm$^2$/h. In other words, the diffusion constant of boron is an order of magnitude greater than that of arsenic. Thus, arsenic is diffused by about 2.5 μm to 3.0 μm and boron is diffused by about 7.5 μm in the lateral direction (which is perpendicular to the depth direction of the trench) from the inner walls of the trench 15.

Figure 7:
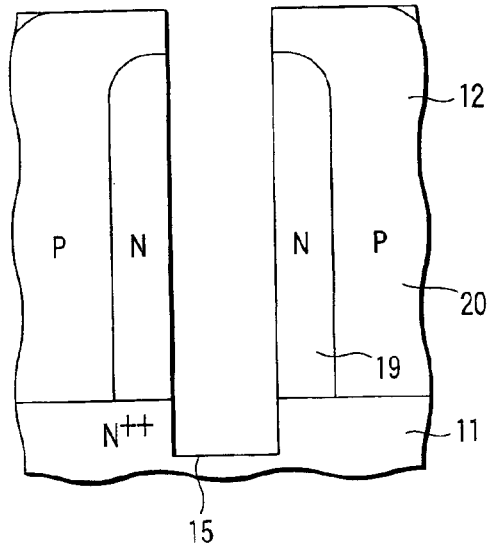
FIG. 7 is a cross-sectional view showing a manufacturing step subsequent to the step of FIG. 6.

As shown in FIG. 7, the mask layer 13 and thermal oxide film 18 are removed using, e.g., a fluorine-type chemical solution.

Figure 8:
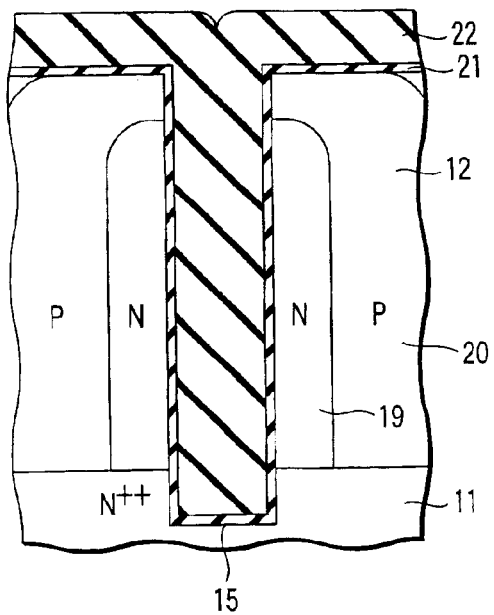
FIG. 8 is a cross-sectional view showing a manufacturing step subsequent to the step of FIG. 7.

As shown in FIG. 8, an oxide film 21 having a thickness of about 1.2 μm is formed on the surfaces of the semiconductor layer 12 and trench 15. Then, a buried layer 22 is formed on the oxide film 21, with the result that the trench 15 is filled with the buried layer 22 and oxide film 21.

Figure 9:
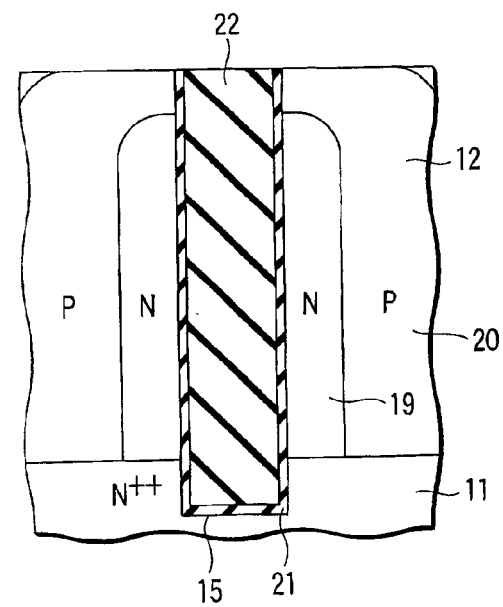
FIG. 9 is a cross-sectional view showing a manufacturing step subsequent to the step of FIG. 8.

Referring to FIG. 9, the buried layer 22 and oxide film 21 are removed by CMP (chemical mechanical polishing) or etching so as to expose the surface of the semiconductor layer 12. The surfaces of these layers 12 and 22 are therefore flattened.

Figure 10:
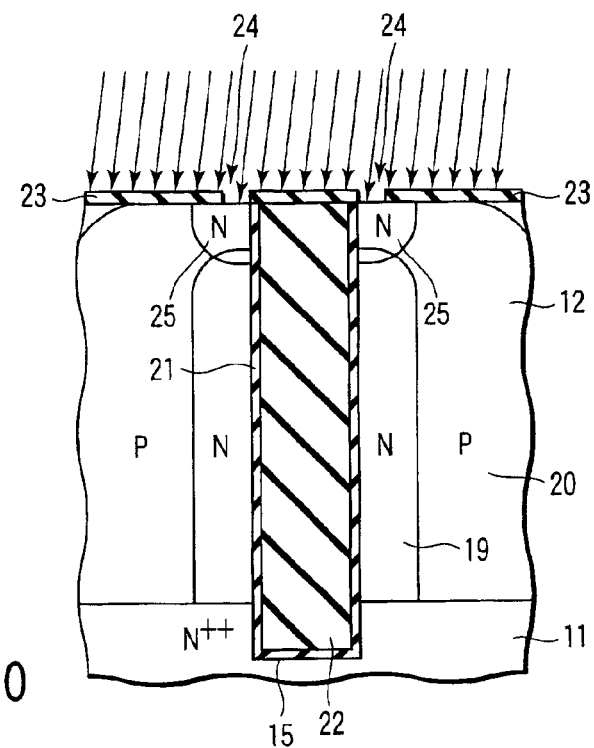
FIG. 10 is a cross-sectional view showing a manufacturing step subsequent to the step of FIG. 9.

As illustrated in FIG. 10, a mask layer 23 composed of, e.g., a thermal oxide film having a thickness of 4000 Å is formed on the flattened surfaces of the layers 12 and 22. Then, the mask layer 23 is patterned by lithography and etching to form an opening 24 through which part of the surface of the semiconductor layer 12 is exposed. The opening 24 is formed so as to expose the surface of the semiconductor layer 12 in the vicinity of the upper end portion of the trench 15. The width of the opening 24 is, for example, 0.2 μm to 3.0 μm. The reason is as follows. If the width is smaller than 0.2 μm, ion implantation for forming a second N-type pillar layer 25 (described later) cannot be performed sufficiently. If the width is larger than 3.0 μm, a region for a base layer 26 (described later) cannot be secured or the channel length is shortened. The width of the opening 24 is indicated by a numeric value corresponding to the respective dimensions exemplified in the first embodiment and can be varied appropriately with variations in the dimensions.

For example, phosphorus (P) is ion-implanted through the opening 24 as N-type impurities and then thermally diffused. The ion implantation of phosphorus is performed under conditions that an acceleration voltage is 40 keV and a dose is $2.0 \times 10^{12}$ cm$^{-2}$. The diffusion is performed in an atmosphere of nitrogen under conditions that temperature is 1150° C. and diffusion time is 70 minutes, with the result that a second N-type pillar layer 25 is formed on either side of the trench 15 in the upper area of the semiconductor layer 12. The layer 25 contacts the first N-type pillar layer 19. After that, the mask layer 23 is removed.

A base layer 26 is selectively formed in a surface area of the semiconductor layer 12 and a source layer 27 is selectively formed in the surface area of the base layer 26 using a known technique, as shown in FIG. 1. A gate electrode 28 is formed on the semiconductor layer 12 with a gate insulation film interposed therebetween and covered with an interlayer insulation film 29. A source electrode 30 is formed on the interlayer insulation film 29 and a drain electrode 31 is formed on the undersurface of the substrate 11. The base layer 26 and source layer 27 can be formed in self-alignment using the gate electrode 28 as a mask.

Figure 11:
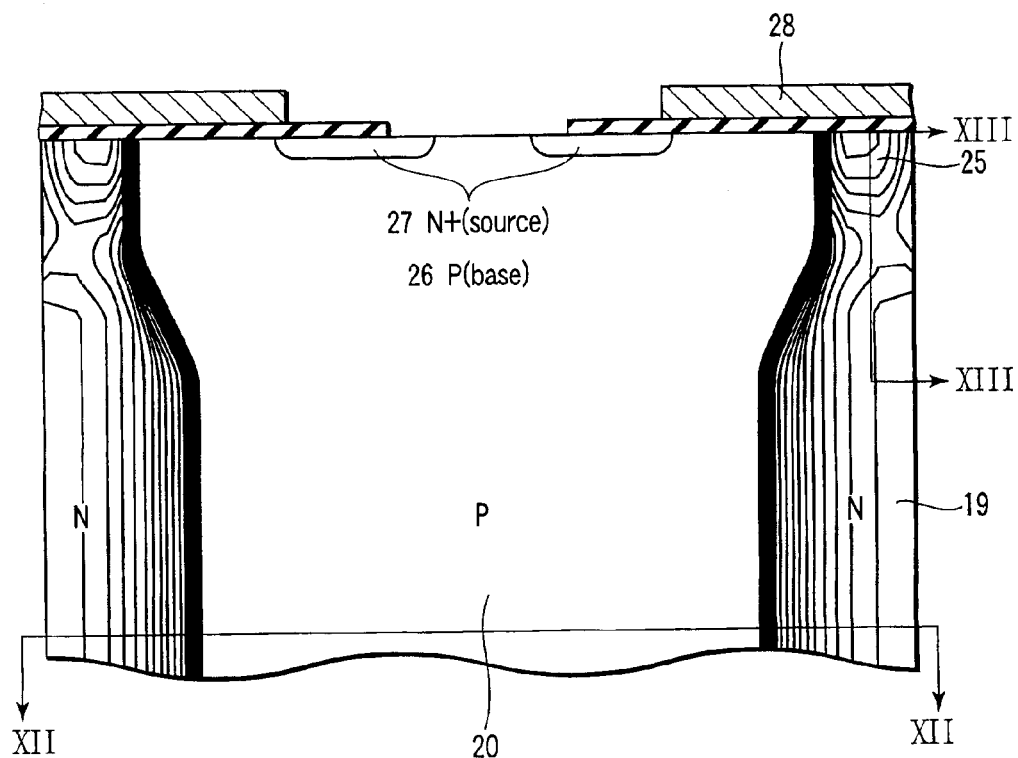
FIG. 11 is a cross-sectional view of the semiconductor device shown in FIG. 1, which shows a contour map of the distribution of concentrations of an N-type pillar layer.
Figure 12:
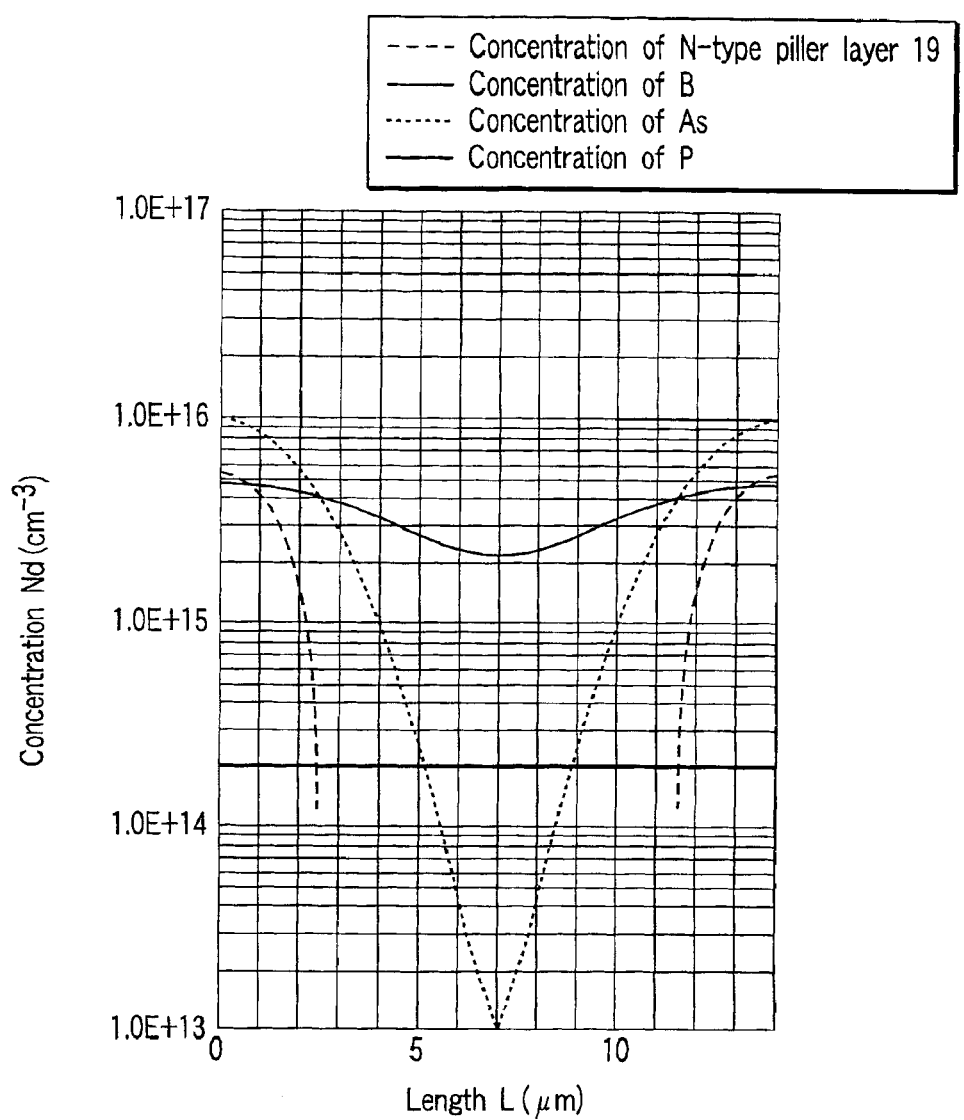
FIG. 12 is a graph of the distribution of concentrations in the cross-sectional view taken along line XII—XII of FIG. 11.
Figure 13:
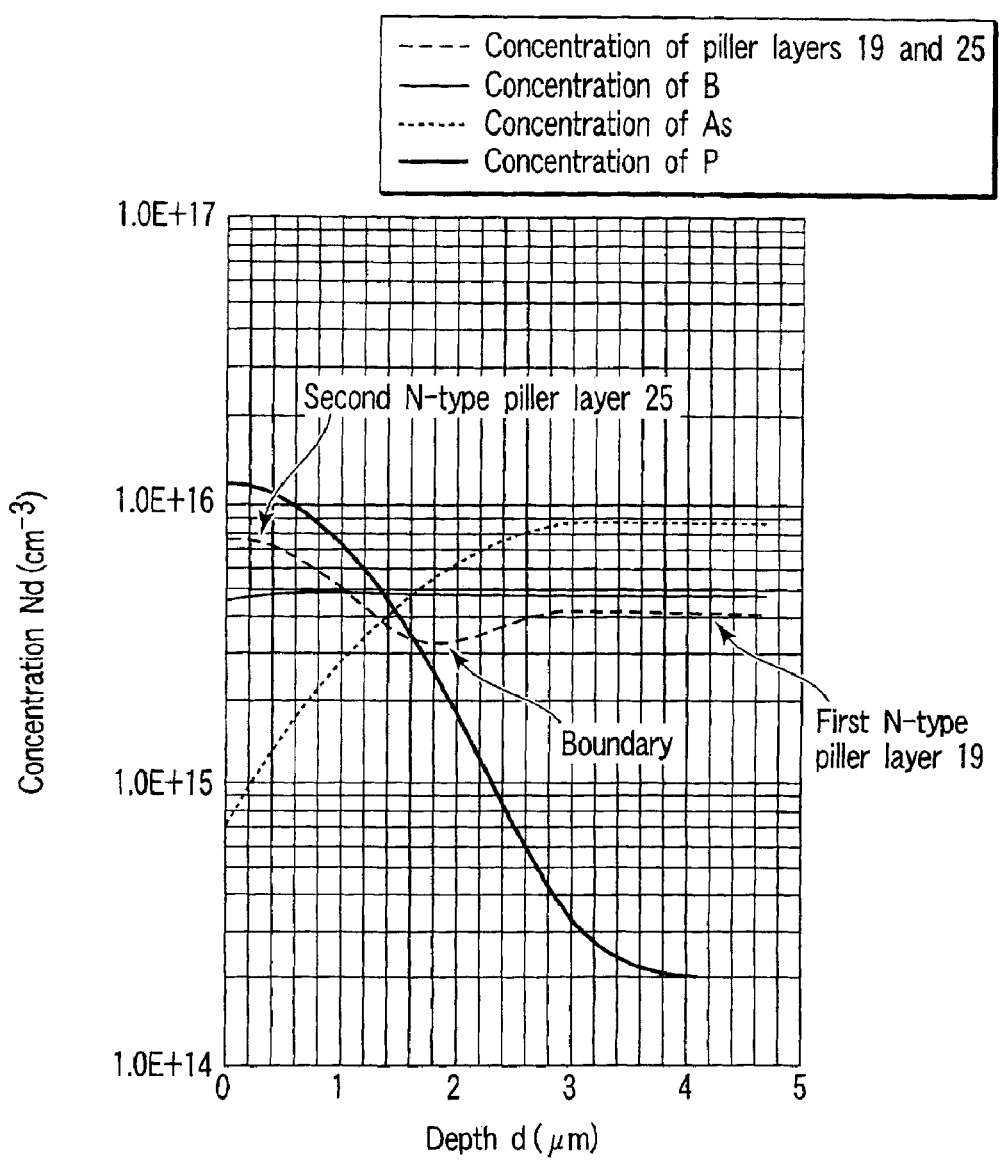
FIG. 13 is a graph of the distribution of concentrations in the cross-sectional view taken along line XIII—XIII of FIG. 11.

FIG. 11 is a cross-sectional view of part of the semiconductor device shown in FIG. 1, which shows a contour map of the distribution of concentrations of the N-type pillar layer. FIG. 12 shows the distribution of concentrations in the cross-sectional view taken along line XII—XII of FIG. 11. FIG. 13 shows the distribution of concentrations in the cross-sectional view taken along line XIII—XIII of FIG. 11. The following are descriptions of the distribution of concentrations of the semiconductor device according to the first embodiment.

Referring to FIG. 11, since the second N-type pillar layer 25 is formed, a region whose impurity concentration is equal to or higher than that of the first N-type pillar layer 19 is formed up to the surface of the semiconductor layer 12.

As depicted in FIG. 12, the concentration Nd of arsenic in the semiconductor layer 12 increases toward the sides of the trench 15. In other words, the N-type pillar layer 19 is formed on either side of the trench 15. On the other hand, the concentration Nd of arsenic in the central area of the semiconductor layer 12 between trenches 15 is low and the concentration Nd of boron is higher than that of arsenic. The P-type pillar layer 20 is formed in this area. The impurity concentration Nd of the first N-type pillar layers 19 formed on the sides of the pillar 15 is about $5 \times 10^{15}$ cm$^{-3}$. The concentration Nd of phosphorus is almost constant at about $2 \times 10^{14}$ cm$^{-3}$.

As shown in FIG. 13, the concentration of arsenic for forming the first N-type pillar layer 19 decreases toward the surface of the semiconductor layer 12, while that of phosphorus for forming the second N-type pillar layer 25 increases. As a result of combination of these impurity concentrations, the impurity concentration Nd of the N-type pillar layer 25 formed in the surface area of the semiconductor layer 12 becomes about $1 \times 10^{16}$ cm$^{-3}$. In other words, the impurity concentration Nd of the second N-type pillar layer 25 is about ten times as high as that of the first N-type pillar layer 19. The former impurity concentration can be more than ten times as high as the latter impurity concentration. Further, the impurity concentration Nd of a boundary between the first and second N-type pillar layers 19 and 25 is lower than that of the first N-type pillar layer 19. The concentration Nd of boron for forming the P-type pillar layer 20 is almost constant in the depth direction of the semiconductor layer 12.

According to the first embodiment, the second N-type pillar layer 25 is formed on either side of the trench 15 in the upper area of the semiconductor layer 12 and contacts the first N-type pillar layer 19. Therefore, even though ions cannot be implanted sufficiently into the inner wall of the trench 15 in the upper area of the semiconductor layer 12 due to a projection of the mask layer 13, an N-type diffusion region can be formed up to the top surface of the semiconductor layer 12 if the second N-type pillar layer 25 is formed later on. Consequently, a current path can be secured between the source and drain.

The second N-type pillar layer 25 whose concentration is higher than that of the first N-type pillar layer 19 is formed on either side of the trench 15 in the upper area of the semiconductor layer 12. It is thus possible to ease the concentration of current on either side of the trench 15 in the upper area of the semiconductor layer 12. Accordingly, the resistance of elements can be decreased.

It has been described above that the base layer 26 contacts the first and second N-type pillar layers 19 and 25. The advantage of the first embodiment described above also can be obtained while the base layer 26 does not contact the first and second N-type pillar layers 19 and 25. Any additional advantage obtained when the base layer 26 does not contact the layers 19 and 25 will be described below.

Figure 14A:
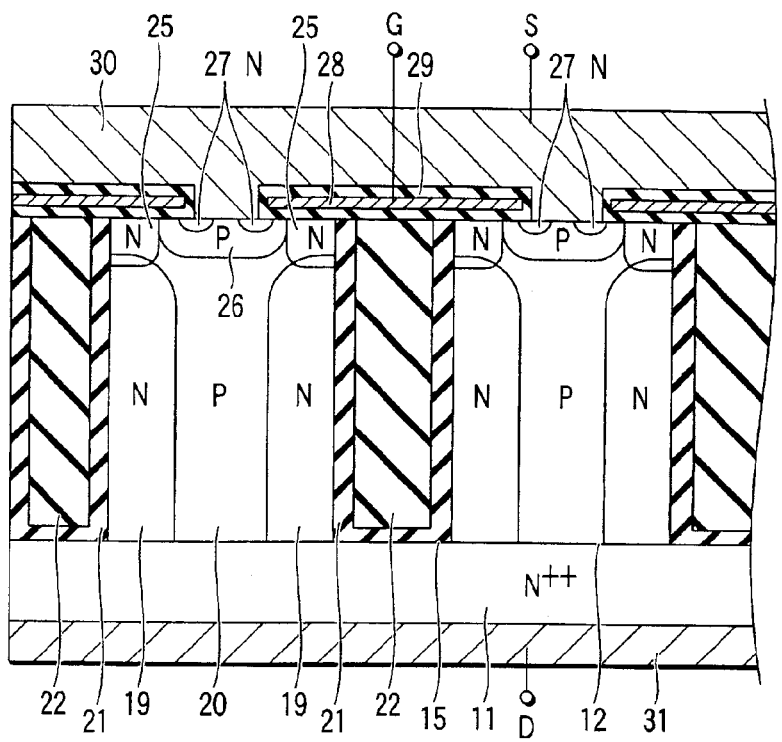
FIGS. 14A and 14B are cross-sectional views of the semiconductor device according to first and second modification of the first embodiment of the present invention.

For a first modification, a PN junction can be formed only between the base layer 26 and the second N-type pillar layer 25 as shown in FIG. 14A, with the result that the P-type pillar layer 20 having lower concentration than the base layer 26 exists between the base layer 26 and the first N-type pillar layer 19. An electric field can thus be prevented from concentrating on the corner portion of the base layer 26 when a reverse bias is applied between the drain and source. It is thus possible to prevent the semiconductor device from decreasing in withstand voltage.

Figure 14B:
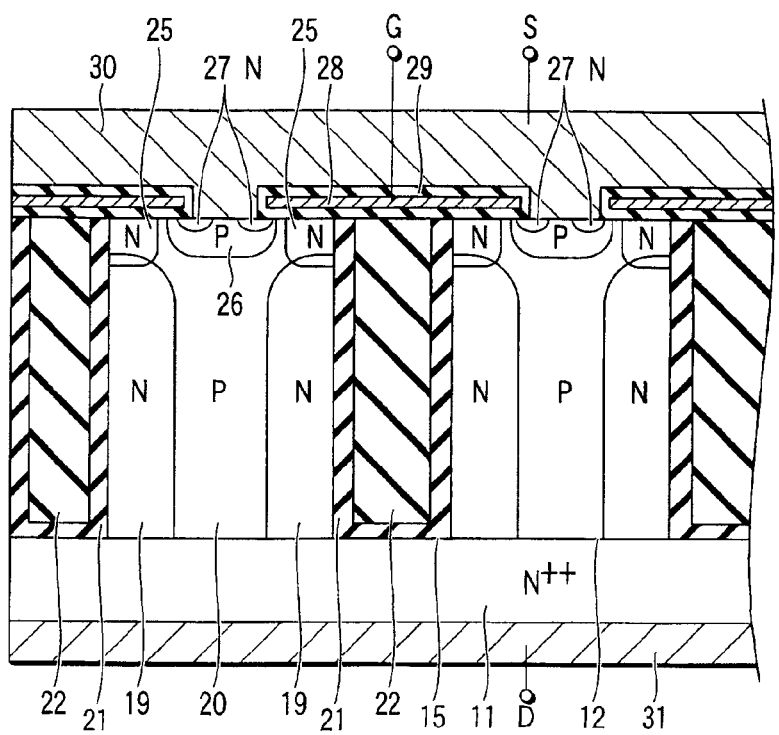

For a second modification, as shown in FIG. 14B, the P-type pillar layer 20 can be left to the surface of the semiconductor layer 12 if the second N-type pillar layer 25 or base layer 26 is decreased in length in the lateral direction. In other words, the base layer 26 and second N-type pillar layer 25 do not contact each other. Since, in this case, an inverted region is formed in the P-type pillar layer 20, no current path is cut off. Thus, the area of opposing portions of the drain (second N-type pillar layer 25) and the gate electrode 28 decreases, and the drain-to-gate capacitance can be reduced while same advantage as that of the first modification can be obtained the same time. The semiconductor device can thus be operated at high speed.

Second Embodiment

Figure 15:
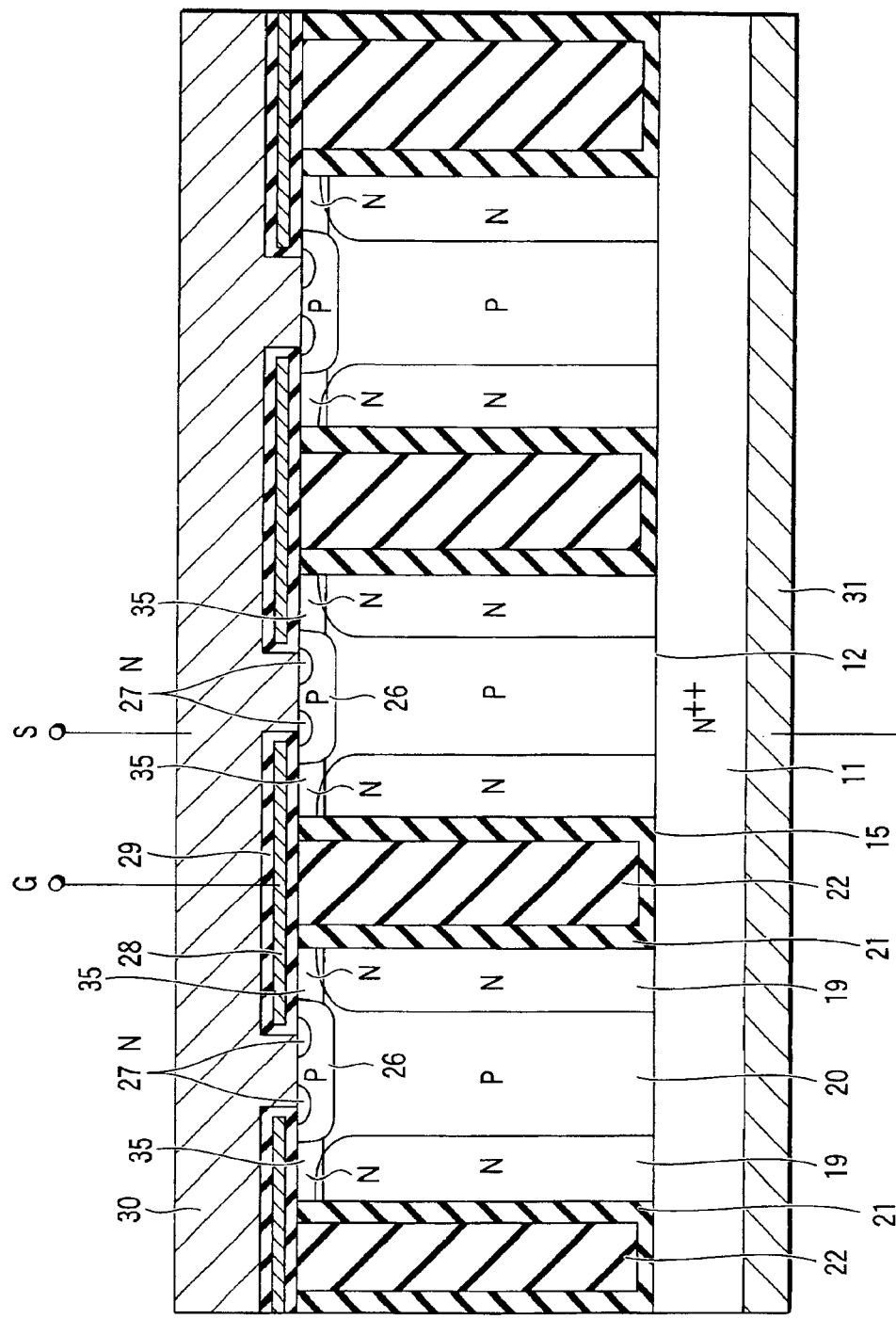
FIG. 15 is a schematic cross-sectional view of a semiconductor device according to a second embodiment of the present invention.

FIG. 15 is a schematic cross-sectional view showing a semiconductor device according to a second embodiment of the present invention as a DTMOS having a vertical NPN structure.

Referring to FIG. 15, a second N-type pillar layer 35 is provided so as to extend in the lateral direction along the surface of a semiconductor layer 12. One side of the layer 35 contacts a trench 15 and the other side contacts the base layer 26, and the bottom portion thereof overlaps the top portion of a first N-type pillar layer 19. The first and second N-type pillar layers 19 and 35 serve as a source-to-drain current path.

Figure 16:
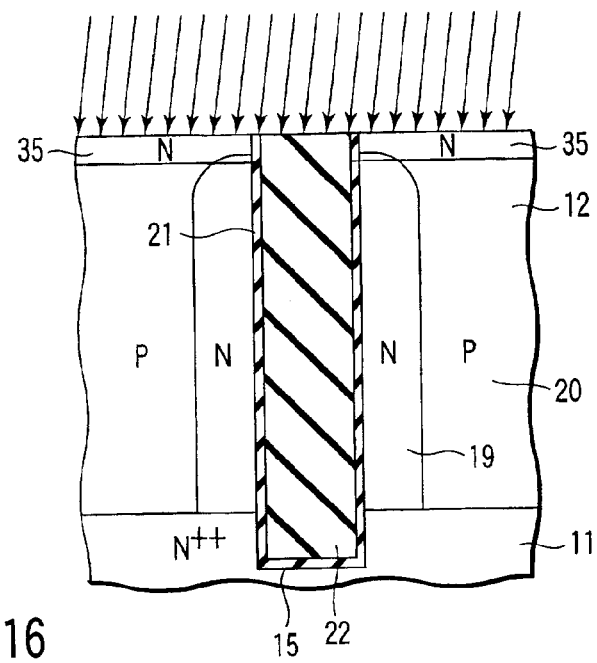
FIG. 16 is a schematic cross-sectional view showing a manufacturing step of the semiconductor device according to the second embodiment of the present invention, which is subsequent to the step shown in FIG. 9.

FIG. 16 is a schematic cross-sectional view showing a manufacturing step of the semiconductor device according to the second embodiment of the present invention. A method of manufacturing the semiconductor device will now be described.

As in the first embodiment shown in FIGS. 2 to 9, a first N-type pillar layer 19 and a P-type pillar layer 20 are formed on either side of a trench 15. After that, the trench 15 is filled with a buried layer 22 and the surfaces of a semiconductor layer 12 and the buried layer 22 are flattened.

As illustrated in FIG. 16, the mask layer 23 shown in FIG. 9 is not formed, but N-type impurities such as phosphorus are ion-implanted into the whole of the flattened surfaces of the layers 12 and 22 and then thermally diffused. As a result, a second N-type pillar layer 35 is formed on the surface of the semiconductor layer 12 in contact with the first N-type pillar layer 19. When phosphorus is used as N-type impurities, the ion implantation is performed under conditions that an acceleration voltage is 40 keV and a dose is $1.5 \times 10^{12}$ cm$^{-2}$ and the diffusion is done in an atmosphere of nitrogen under conditions that temperature is 1150° C. and diffusion time is 20 minutes.

The second N-type pillar layer 35 is formed on the entire surface of the semiconductor layer 12. This formation presents no problem if the concentration of the second N-type pillar layer 35 is considerably lower than that of a P-type base layer 26 (described later) formed in the layer 35.

Then, a high-concentration P$^+$-type base layer 26 is selectively formed in the surface area of the semiconductor layer 12 using a known technique as shown in FIG. 15. When boron is used as P-type impurities, the ion implantation is performed under conditions that an acceleration voltage is 60 keV and a dose is $3.0 \times 10^{14}$ cm$^{-2}$. The diffusion is done in an atmosphere of nitrogen under conditions that temperature is 1150° C. and diffusion time is 230 minutes. After that, a high-concentration source layer 27 is selectively formed in the surface area of the base layer 26, as in the first embodiment. Then, a gate electrode 28 is formed on the semiconductor layer 12 with a gate insulation film interposed therebetween, and an interlayer insulation film 29, a source electrode 30, and a drain electrode 31 are formed.

Figure 17:
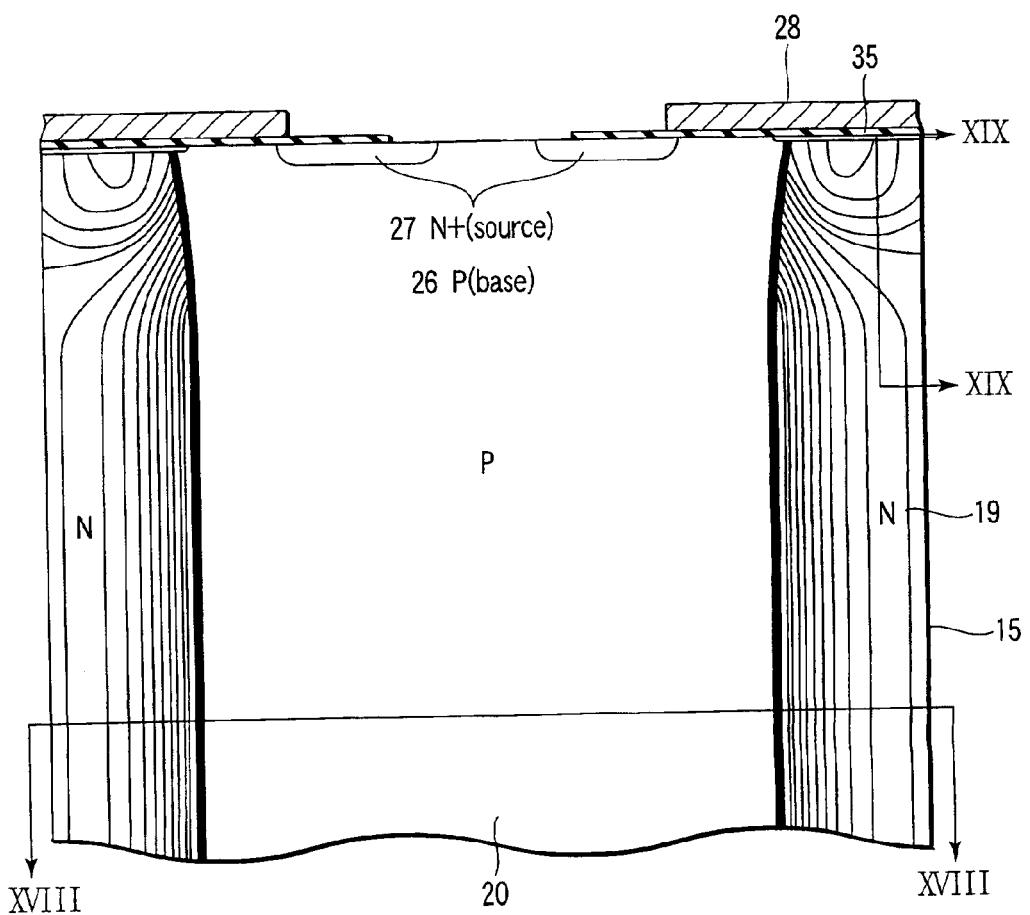
FIG. 17 is a contour map of the distribution of concentrations of an N-type pillar layer in the semiconductor device shown in FIG. 15.
Figure 18:
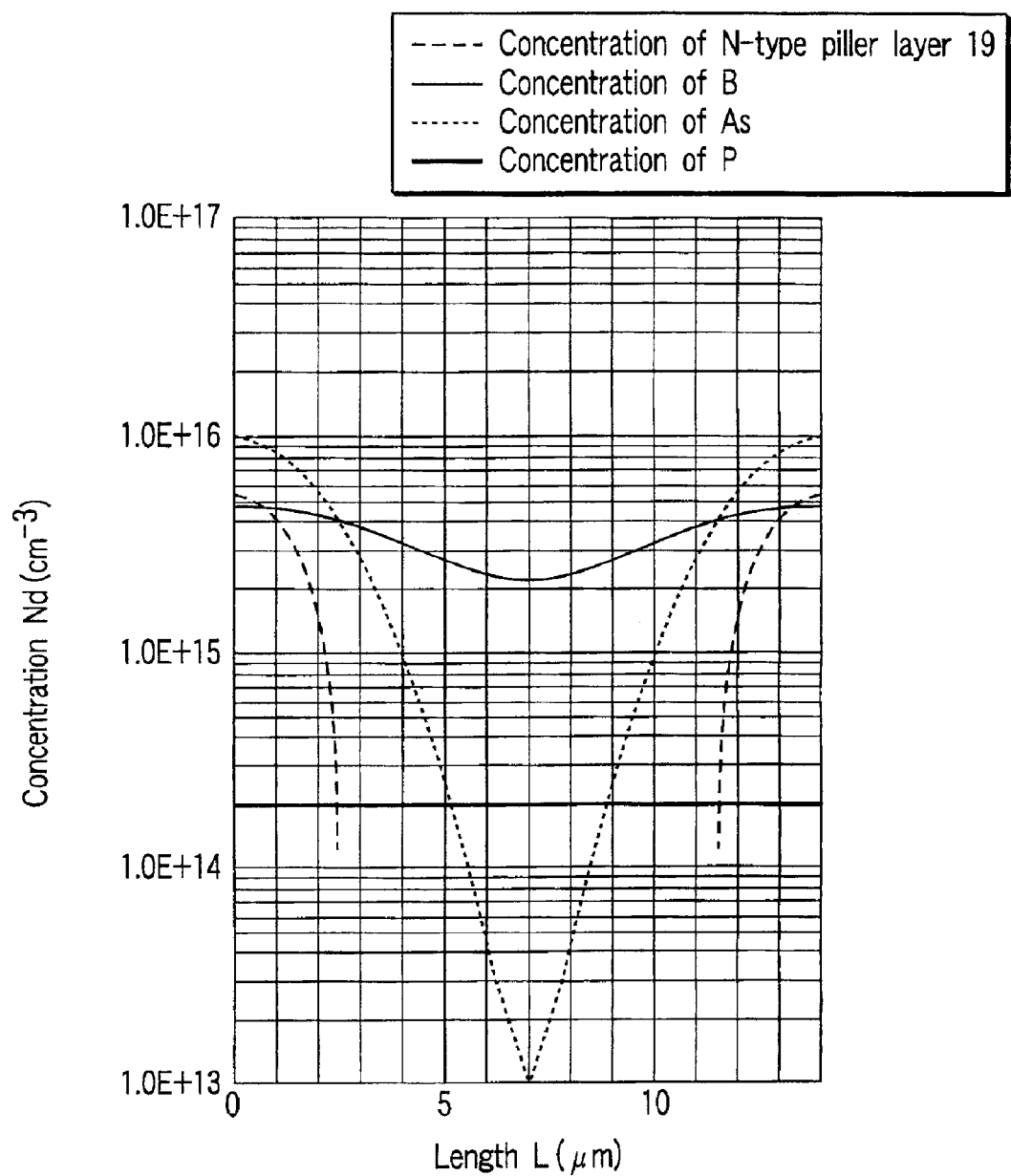
FIG. 18 is a map of the distribution of concentrations taken along line XVIII—XVIII of FIG. 17.
Figure 19:
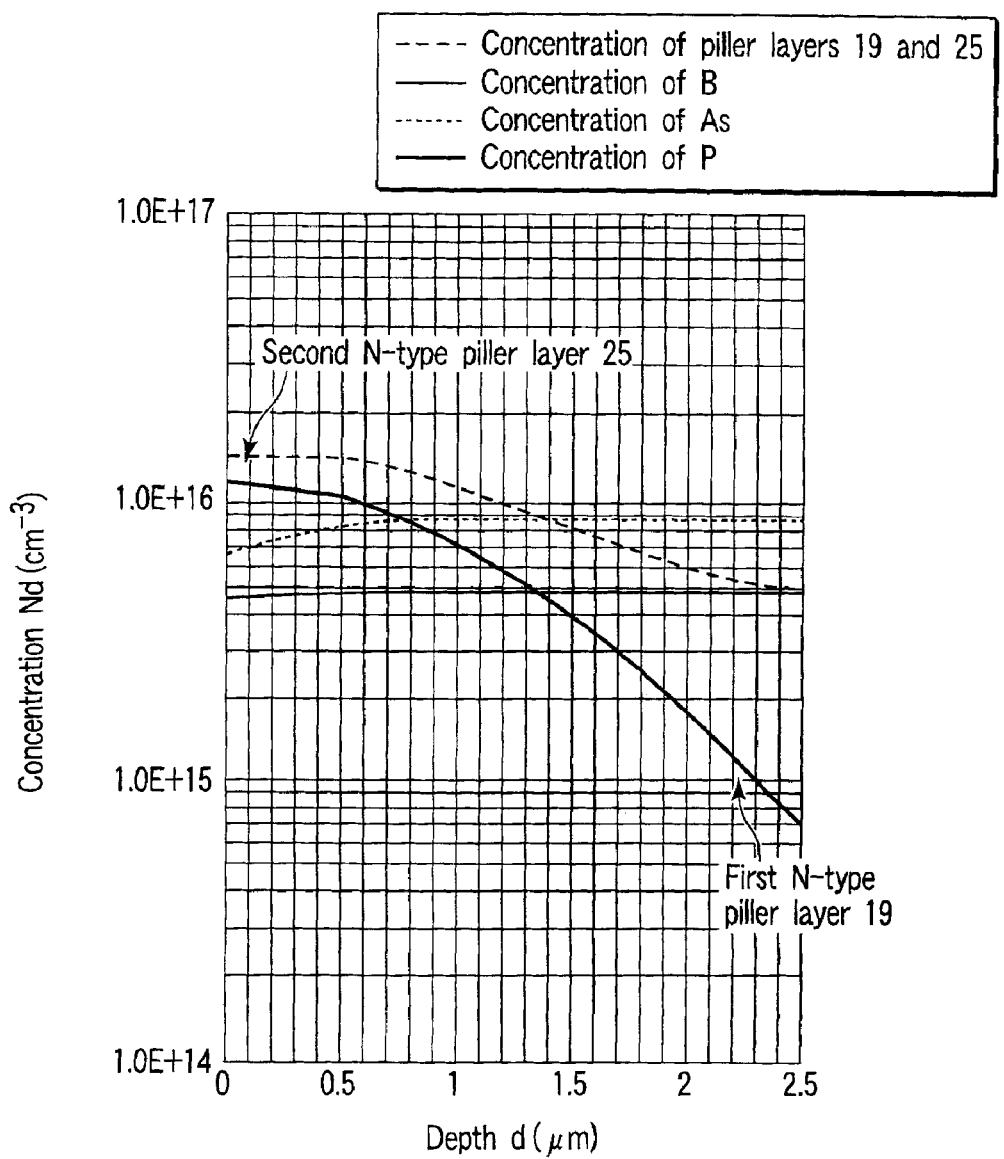
FIG. 19 is a map of the distribution of concentrations taken along line XIX—XIX of FIG. 17.

FIG. 17 is a cross-sectional view of the semiconductor device according to the second embodiment of the present invention, which shows a contour map of the distribution of concentrations of the N-type pillar layer. FIG. 18 shows the distribution of concentrations in the cross-sectional view taken along line XVIII—XVIII of FIG. 17. FIG. 19 shows the distribution of concentrations in the cross-sectional view taken along line XIX—XIX of FIG. 17. The following are descriptions of the distribution of concentrations of the semiconductor device according to the second embodiment.

Since the second N-type pillar layer 35 is formed, a region whose impurity concentration is equal to or higher than that of the first N-type pillar layer 19 is formed up to the surface of the semiconductor layer 12 as shown in FIG. 17. The impurity concentration of the N-type pillar layer 35 is uniform in the lateral direction (which is perpendicular to the depth direction of the trench 15) of the surface of the semiconductor layer 12.

In the case of FIG. 17, when an amount of projection of the mask layer 13 is about 0.4 $\mu$m, ion implantation is performed into a region that is 3 $\mu$m or more deep from the surface of the semiconductor layer 12 and consequently the first N-type pillar layer 19 is formed from the depth of 1 $\mu$m from the surface of the semiconductor layer 12.

As shown in FIG. 18, the concentration Nd of arsenic in the semiconductor layer 12 increases toward the sides of the trench 15. The N-type pillar layer 19 is therefore formed on either side of the trench 15. On the other hand, the concentration Nd of arsenic in the central area of the semiconductor layer 12 between trenches 15 is low and the concentration Nd of boron is higher than that of arsenic. The P-type pillar layer 20 is therefore formed. The impurity concentration Nd of the first N-type pillar layer 19 formed on either side of the pillar 15 is about $5 \times 10^{15}$ cm$^{-3}$. The concentration Nd of phosphorus, which is implanted when the semiconductor layer 12 is formed, is almost constant at $2 \times 10^{14}$ cm$^{-3}$. The distribution of concentrations in the cross-sectional view taken along line XVIII—XVIII of FIG. 17 is the same as that in the first embodiment shown in FIG. 12.

As depicted in FIG. 19, the concentration of arsenic for forming the first N-type pillar layer 19 decreases toward the surface of the semiconductor layer 12, while that of phosphorus for forming the second N-type pillar layer 35 increases abruptly. As a result of combination of these impurity concentrations, the impurity concentration Nd of the N-type pillar layer 35 formed in the surface area of the semiconductor layer 12 is about $1 \times 10^{16}$ cm$^{-3}$. In other words, the impurity concentration Nd of the second N-type pillar layer 35 is about ten times as high as that of the first N-type pillar layer 19. The former impurity concentration can be more than ten times as high as the latter impurity concentration. The concentration Nd of boron for forming the P-type pillar layer 20 is almost constant in the depth direction of the semiconductor layer 12.

The same advantage as that of the first embodiment can be obtained from the second embodiment.

Since a step of forming the mask layer 23 and a step of patterning it are unnecessary, the process of the second embodiment is simpler than that of the first embodiment.

According to the second embodiment, the impurity concentration of the N-type pillar layer 35 can be uniformed in the lateral direction of the surface of the semiconductor layer 12. Thus, the concentration of current on either side of the trench 15 in the upper area of the semiconductor layer 12 can be eased more greatly than that in the first embodiment. Accordingly, the resistance of the devices can be decreased further.

It is needless to say that the same advantage as that of the first embodiment can be obtained if the base layer 26 does not contact the first and second N-type pillar layers 19 and 35.

Third Embodiment

Figure 20:
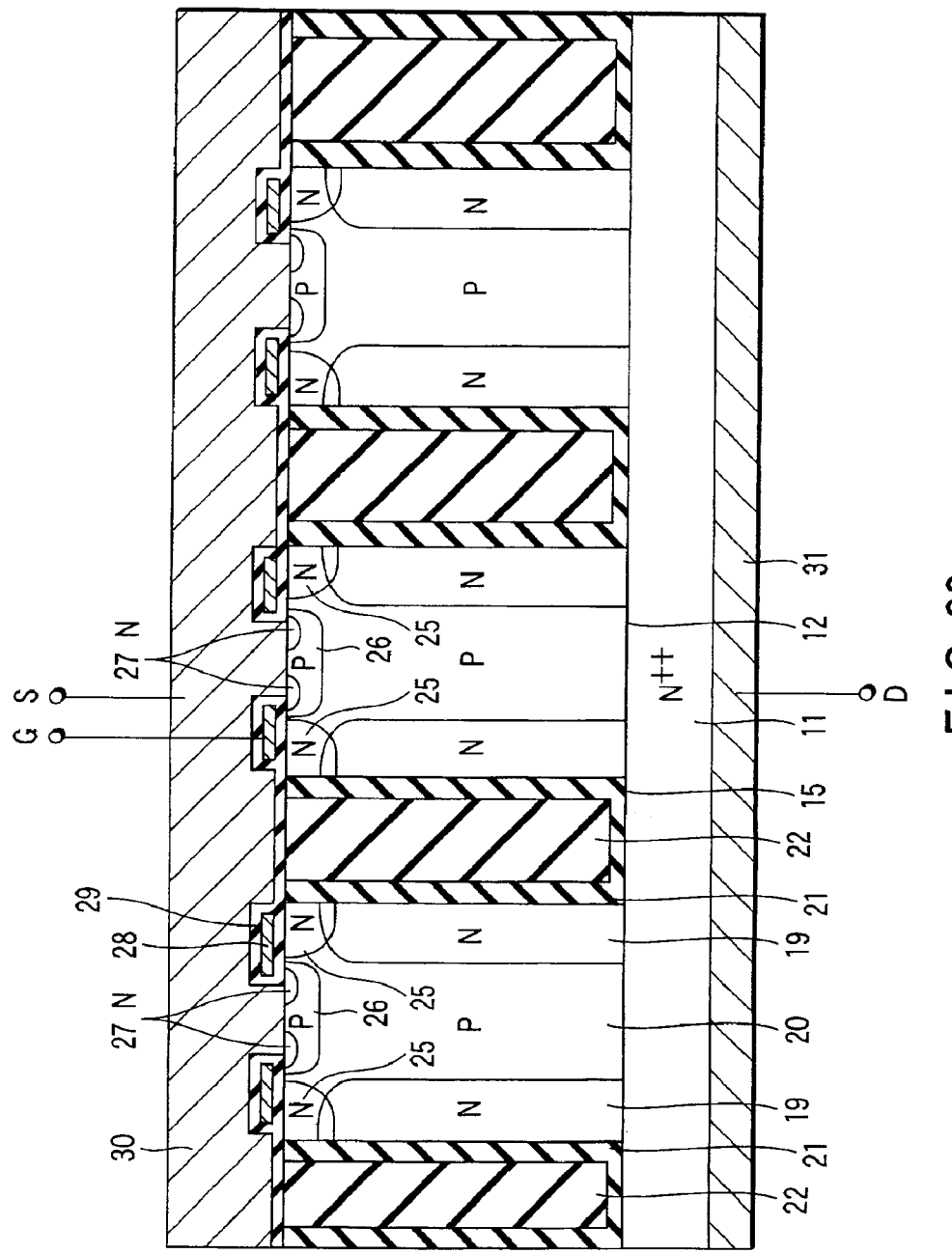
FIG. 20 is a schematic cross-sectional view of a semiconductor device according to a third embodiment of the present invention.

FIG. 20 is a schematic cross-sectional view showing a semiconductor device according to a third embodiment of the present invention as a DTMOS having a vertical NPN structure. Referring to FIG. 20, a gate electrode 28 is not formed above a trench 15 but separates from one end of the trench 15 and extends onto a channel region between one end of a base layer 26 and that of a source layer 27. The other structure is the same as that of the first embodiment.

FIG. 21 is a schematic cross-sectional view showing a manufacturing step of the semiconductor device with the above-described structure. As in the first embodiment shown in FIGS. 2 to 9, a trench 15, a first N-type pillar layer 19, a P-type pillar layer 20, and a buried layer 22 are formed.

As illustrated in FIG. 21, a gate insulation film 51 is formed and then a conductive film is formed on the gate insulation film 51. The conductive film is patterned by lithography and etching, thus forming a gate electrode 28 that separates from one end of the trench 15 and extends onto a channel region between one end of the base layer 26 and that of the source layer 27. Then, a mask layer 52 is formed on the semi-conductor layer 12. The mask layer 52 has substantially the same end portion as that of the gate electrode 28. After that, ion implantation is performed using the gate electrode 28 as a mask to form a second N-type pillar layer 25 in self-alignment. Proper alignment is not therefore required when the mask layer 52 is patterned.

As depicted in FIG. 20, the mask layer 52 is removed and then ion implantation is performed using the gate electrode 28 as a mask to form a base layer 26 in self-alignment. The second N-type pillar layer 25 and base layer 26 can be formed using the mask layer 52 as a mask. After that, a source layer 27, an interlayer insulation film 29, a source electrode 30, and a drain electrode 31 are formed through the same steps as those of the first embodiment. A wiring layer comprising conductive layer of polysilicon or the like can be formed on the gate electrodes 28, with the result that wiring resistance of the gate electrodes 28 can decrease.

The same advantages as those of the first and second embodiments can be obtained from the third embodiment.

According to the third embodiment, the second N-type pillar layer 25 is formed in self-alignment using the gate electrode 28 as a mask. Consequently, the second N-type pillar layer 25 can be formed without causing any misalignment between the layer 25 and electrode 28. As mentioned above, the base layer 26 is also formed in self-alignment using the gate electrode 28 as a mask. Therefore, misalignment between the second pillar layer 25 and the base layer 26 can be avoided.

The area of opposing portions of the drain (second N-type pillar layer 25) and the gate electrode 28 can be made much smaller than that in the first and second embodiments. Accordingly, the drain-to-gate capacitance can be reduced further and the semiconductor device can be operated at high speed. Furthermore, the wiring layer provided on the gate electrode 28 can decrease a wiring resistance of the gate electrode 28, while the drain-to-gate capacitance can be reduced.

When the first N-type pillar layer 19 is formed by ion implantation through the inner walls of the trench 15, the impurity concentration of the layer 19 increases toward the sides of the trench 15. For this reason, when a reverse bias is applied between the drain and source, the depletion of the high-concentration portion is delayed. According to the third embodiment, since the area of opposing portions between the high-concentration portion and the gate electrode 28 can be decreased, the capacitance can be reduced; consequently, the semiconductor device can be operated at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type;
   a semiconductor layer provided on the semiconductor substrate;
   a trench extending in a depth direction toward the semiconductor substrate from a surface of the semiconductor layer;
   a first region of the first conductivity type formed in the depth direction on and along a side of the trench in the semiconductor layer, a bottom of the first region contacting the semiconductor substrate;
   a second region of the first conductivity type formed in a surface area of the semiconductor layer and close to the side of the trench, the second region being positioned above the first region and contacting the first region, the second region being a region different from the first region;

a third region of the second conductivity type formed in the surface area of the semiconductor layer;

a fourth region of the first conductivity type formed in a surface area of the third region; and a gate electrode provided on a surface of the third region between the second region and the fourth region, a gate insulation film being interposed between the gate electrode and the second region.

2. The semiconductor device according to claim 1, wherein the first and second regions contact the third region respectively.

3. The semiconductor device according to claim 1, wherein the first region separates from an end of the third region and the second region contacts the third region.

4. The semiconductor device according to claim 1, wherein the first and second regions separate from an end of the third region.

5. The semiconductor device according to claim 1, wherein the gate electrode extends above the trench.

6. The semiconductor device according to claim 1, wherein the second region is formed in self-alignment with the gate electrode.

7. The semiconductor device according to claim 1, wherein impurity concentration of a surface of the second region is equal to or higher than that of a portion of the first region which is formed on the side of the trench and close to the trench.

8. The semiconductor device according to claim 1, wherein impurity concentration of a surface of the second region is almost uniform in a lateral direction.

9. The semiconductor device according to claim 1, wherein impurity concentration of the second region is more than ten times as high as that of the first region.

10. The semiconductor device according to claim 1, wherein impurity concentration of a boundary between the first region and the second region is lower than that of the first region.

11. The semiconductor device according to claim 1, wherein the second region includes impurities different from those included in the first region.

12. The semiconductor device according to claim 11, wherein the first region includes arsenic and the second region includes phosphorus.

13. The semiconductor device according to claim 1, wherein the second region is different from the first region in size.

14. The semiconductor device according to claim 1, wherein the second region is smaller than the first region.

15. The semiconductor device according to claim 1, wherein the second region is different from the first region in impurity concentration.

16. The semiconductor device according to claim 1, wherein the second region includes an area where an impurity concentration is higher than that of the first region.

17. The semiconductor device according to claim 1, wherein the second region is independently formed from the first region.

18. A semiconductor device comprising:

a semiconductor substrate of a first conductivity type;

a semiconductor layer of a second conductivity type provided on the semiconductor substrate;

a trench extending in a depth direction toward the semiconductor substrate from a surface of the semiconductor layer, the trench buried with a filling layer;

a first region of the first conductivity type formed in the depth direction on and along a side of the trench in the semiconductor layer, a bottom of the first region contacting the semiconductor substrate;

a second region of the first conductivity type formed in a surface area of the semiconductor layer and close to the side of the trench, the second region being positioned above the first region and contacting the first region, the second region being a region different from the first region;

a third region of the second conductivity type formed in the surface area of the semiconductor layer;

a fourth region of the first conductivity type formed in a surface area of the third region; and a gate electrode provided on a surface of the third region between the second region and the fourth region, a gate insulation film being interposed between the gate electrode and the second region.

19. The semiconductor device according to claim 18, wherein the first and second regions contact the third region respectively.

20. The semiconductor device according to claim 18, wherein the first region separates from an end of the third region and the second region contacts the third region.

21. The semiconductor device according to claim 18, wherein the first and second regions separate from an end of the third region.

22. The semiconductor device according to claim 18, wherein the gate electrode extends above the trench.

23. The semiconductor device according to claim 18, wherein the second region is formed in self-alignment with the gate electrode.

24. The semiconductor device according to claim 18, wherein the impurity concentration of the third region is higher than that of the semiconductor layer.

25. The semiconductor device according to claim 18, wherein impurity concentration of a surface of the second region is equal to or higher than that of a portion of the first region which is formed on the side of the trench and close to the trench.

26. The semiconductor device according to claim 18, wherein impurity concentration of a surface of the second region is almost uniform in a lateral direction.

27. The semiconductor device according to claim 18, wherein impurity concentration of the second region is more than ten times as high as that of the first region.

28. The semiconductor device according to claim 18, wherein impurity concentration of a boundary between the first region and the second region is lower than that of the first region.

29. The semiconductor device according to claim 18, wherein the second region includes impurities different from those included in the first region.

30. The semiconductor device according to claim 29, wherein the first region includes arsenic and the second region includes phosphorus.

31. The semiconductor device according to claim 18, wherein the second region is different from the first region in size.

32. The semiconductor device according to claim 18, wherein the second region is smaller than the first region.

33. The semiconductor device according to claim 18, wherein the second region is different from the first region in impurity concentration.

34. The semiconductor device according to claim 18, wherein the second region includes an area where an impurity concentration is higher than that of the first region.

35. The semiconductor device according to claim 18, wherein the second region is independently formed from the first region.

36. A semiconductor device comprising:
a semiconductor substrate of a first conductivity type;
a semiconductor layer provided on the semiconductor substrate;
a trench extending in a depth direction toward the semiconductor substrate from a surface of the semiconductor layer;
a first region of the first conductivity type formed in the depth direction on and along a side of the trench in the semiconductor layer, a bottom of the first region contacting the semiconductor substrate;
a second region of the first conductivity type formed in a surface area of the semiconductor layer and close to the side of the trench, the second region contacting the first region, and a portion of the second region having impurity concentration different from that of the first region;
a third region of the second conductivity type formed in the surface area of the semiconductor layer;
a fourth region of the first conductivity type formed in a surface area of the third region; and
a gate electrode provided on a surface of the third region between the second region and the fourth region, a gate insulation film being interposed between the gate electrode and the second region.

37. The semiconductor device according to claim 36, wherein the first and second regions contact the third region respectively.

38. The semiconductor device according to claim 36, wherein the first region separates from an end of the third region and the second region contacts the third region.

39. The semiconductor device according to claim 36, wherein the first and second regions separate from an end of the third region.

40. The semiconductor device according to claim 36, wherein the gate electrode extends above the trench.

41. The semiconductor device according to claim 36, wherein the second region is formed in self-alignment with the gate electrode.

42. The semiconductor device according to claim 36, wherein impurity concentration of a surface of the second region is equal to or higher than that of a portion of the first region which is formed on the side of the trench and close to the trench.

43. The semiconductor device according to claim 36, wherein impurity concentration of a surface of the second region is almost uniform in a lateral direction.

44. The semiconductor device according to claim 36, wherein impurity concentration of the second region is more than ten times as high as that of the first region.

45. The semiconductor device according to claim 36, wherein impurity concentration of a boundary between the first region and the second region is lower than that of the first region.

46. The semiconductor device according to claim 36, wherein the second region includes impurities different from those included in the first region.

47. The semiconductor device according to claim 46, wherein the first region includes arsenic and the second region includes phosphorus.

48. A semiconductor device comprising:
a semiconductor substrate of a first conductivity type;
a semiconductor layer of a second conductivity type provided on the semiconductor substrate;
a trench extending in a depth direction toward the semiconductor substrate from a surface of the semiconductor layer, the trench buried with a filling layer;
a first region of the first conductivity type formed in the depth direction on and along a side of the trench in the semiconductor layer, a bottom of the first region contacting the semiconductor substrate;
a second region of the first conductivity type formed in a surface area of the semiconductor layer and close to the side of the trench, the second region contacting the first region, and a portion of the second region having impurity concentration different from that of the first region;
a third region of the second conductivity type formed in the surface area of the semiconductor layer;
a fourth region of the first conductivity type formed in a surface area of the third region; and
a gate electrode provided on a surface of the third region between the second region and the fourth region, a gate insulation film being interposed between the gate electrode and the second region.

49. The semiconductor device according to claim 48, wherein the first and second regions contact the third region respectively.

50. The semiconductor device according to claim 48, wherein the first region separates from an end of the third region and the second region contacts the third region.

51. The semiconductor device according to claim 48, wherein the first and second regions separate from an end of the third region.

52. The semiconductor device according to claim 48, wherein the gate electrode extends above the trench.

53. The semiconductor device according to claim 48, wherein the second region is formed in self-alignment with the gate electrode.

54. The semiconductor device according to claim 48, wherein the impurity concentration of the third region is higher than that of the semiconductor layer.

55. The semiconductor device according to claim 48, wherein impurity concentration of a surface of the second region is equal to or higher than that of a portion of the first region which is formed on the side of the trench and close to the trench.

56. The semiconductor device according to claim 48, wherein impurity concentration of a surface of the second region is almost uniform in a lateral direction.

57. The semiconductor device according to claim 48, wherein impurity concentration of the second region is more than ten times as high as that of the first region.

58. The semiconductor device according to claim 48, wherein impurity concentration of a boundary between the first region and the second region is lower than that of the first region.

59. The semiconductor device according to claim 48, wherein the second region includes impurities different from those included in the first region.

60. The semiconductor device according to claim 59, wherein the first region includes arsenic and the second region includes phosphorus.

* * * * *